(12) United States Patent
Matsubara et al.

(10) Patent No.: US 9,210,788 B2
(45) Date of Patent: Dec. 8, 2015

(54) POWER SUPPLY APPARATUS

(75) Inventors: Shinobu Matsubara, Kanagawa (JP);
Yoshikuni Horishita, Kanagawa (JP);
Hidenori Yoda, Kanagawa (JP); Yoshio Yanagiya, Kanagawa (JP); Takeo Toda, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 878 days.

(21) Appl. No.: 13/001,454

(22) PCT Filed: Jun. 17, 2009

(86) PCT No.: PCT/JP2009/060988
§ 371 (c)(1),
(2), (4) Date: Dec. 27, 2010

(87) PCT Pub. No.: WO2010/001723
PCT Pub. Date: Jan. 7, 2010

(65) Prior Publication Data
US 2011/0100807 A1    May 5, 2011

(30) Foreign Application Priority Data

Jun. 30, 2008 (JP) ................................ 2008-170806

(51) Int. Cl.
*C23C 14/34* (2006.01)
*H05H 1/46* (2006.01)
(Continued)

(52) U.S. Cl.
CPC .............. *H05H 1/46* (2013.01); *C23C 14/3464* (2013.01); *C23C 14/542* (2013.01); *H01J 37/34* (2013.01); *H01J 37/3444* (2013.01); *H03H 7/40* (2013.01)

(58) Field of Classification Search
CPC ..................... H01J 37/32018; H01J 37/32027; H01J 37/32036; H01J 37/32045; H01J 37/3444; C23C 14/3485; C23C 14/3492
USPC ................... 204/298.08; 315/111.21, 111.41, 315/111.71, 111.91; 363/63, 132; 307/29
See application file for complete search history.

(56) References Cited

U.S. PATENT DOCUMENTS 4,597,847 A * 7/1986 Boys ......................... 204/298.12
5,126,032 A * 6/1992 Szczyrbowski et al. . 204/298.08
(Continued)

FOREIGN PATENT DOCUMENTS

JP      02-243762 A    9/1990
JP      10-152772 A    6/1998
(Continued)

OTHER PUBLICATIONS

International Search Report for PCT Patent App. No. PCT/JP2009/060988 (Sep. 29, 2009).
(Continued)

*Primary Examiner* — John Brayton
(74) *Attorney, Agent, or Firm* — Cermak Nakajima & McGowan LLP; Tomoko Nakajima

(57) ABSTRACT

There is provided a power supply apparatus which is easy in attempting to unify the thickness distribution of a thin film to be formed on the surface of a substrate even at the time of charging pulsed potential at a low frequency to targets that make respective pairs. The power supply apparatus of this invention has: a first discharge circuit which alternately charges predetermined potential to a pair of targets that are in contact with a plasma at a predetermined frequency; and a second discharge circuit which charges predetermined potential between the ground and the target, out of the pair of targets, that is not receiving output from the first discharge circuit.

6 Claims, 3 Drawing Sheets

(51) Int. Cl.
*C23C 14/54* (2006.01)
*H01J 37/34* (2006.01)
*H03H 7/40* (2006.01)

(56) References Cited

U.S. PATENT DOCUMENTS

| | | | | |
|---|---|---|---|---|
| 5,584,972 | A | * 12/1996 | Lantsman | 204/192.12 |
| 5,942,883 | A | * 8/1999 | Preis et al. | 323/282 |
| 6,069,174 | A | * 5/2000 | Fisher et al. | 514/629 |
| 6,440,281 | B1 | * 8/2002 | Sturmer et al. | 204/298.08 |
| 6,735,099 | B2 | * 5/2004 | Mark | 363/63 |
| 8,435,389 | B2 | * 5/2013 | Kadlec et al. | 204/192.12 |
| 2005/0109616 | A1 | 5/2005 | Ohta et al. | |

FOREIGN PATENT DOCUMENTS

| | | |
|---|---|---|
| JP | 3639605 B2 | 1/2005 |
| JP | 2005-133110 A | 5/2005 |
| JP | 2005-290550 A | 10/2005 |
| JP | 2006-299412 A | 11/2006 |
| JP | 2007-186724 A | 7/2007 |
| JP | 2007-186726 A | 7/2007 |
| JP | 2008-138263 A | 6/2008 |

OTHER PUBLICATIONS

Office Action from Korean Patent App. No. 10-2011-7002276 (Oct. 4, 2012).

* cited by examiner

POWER SUPPLY APPARATUS

This application is a national phase entry under 35 U.S.C. §371 of PCT Patent Application No. PCT/JP2009/060988, filed on Jun. 17, 2009, which claims priority under 35 U.S.C. §119 to Japanese Patent Application No. 2008-170806, filed Jun. 30, 2008, both of which are incorporated by reference.

TECHNICAL FIELD

The present invention relates to a power supply apparatus and, in particular, to a power supply apparatus to be used in outputting to targets which make a pair in a sputtering apparatus.

BACKGROUND ART

As a method of forming a predetermined thin film on a surface of a substrate to be processed such as glass or silicon wafer, there is known a sputtering method. The sputtering method is an art in which the ions in a plasma atmosphere are accelerated and collided onto targets which are formed into a predetermined shape depending on the composition of the thin film to be formed on a surface of a substrate, and in which the sputtered particles (atoms of the targets) are scattered for getting adhered and deposited on the surface of the substrate to thereby form a predetermined thin film. Recently the method is used, in the process of manufacturing a flat panel display (FPD), to form a thin film such as an ITO and the like on a large-area substrate.

The following is known as a sputtering apparatus in which a thin film can be efficiently formed at a constant film thickness on a substrate of a larger area. In other words, this sputtering apparatus has: a plurality of targets of the same shape which are disposed at an equal distance from one another, opposite to the substrate to be processed in a vacuum chamber; and an AC power supply which charges a predetermined potential to those respective targets which make pairs, out of the disposed targets, at a predetermined frequency while alternately changing the polarity (by reversing the polarity). While introducing a predetermined sputtering gas in a vacuum, electric power is applied through the AC power supply to the targets that make pairs. By alternately switching each of the targets between anode electrode and cathode electrode, glow discharge is caused to be generated between the anode electrode and the cathode electrode. Plasma atmosphere is thus formed to thereby sputter each of the targets (see, e.g., patent document 1).

Suppose that AC voltage of substantially sinusoidal wave is charged to each of the targets by using the above-mentioned AC power supply. Then, since the output voltage and the output current are continuously varying, it is difficult to detect an anomalous electric discharge (arcing) when it occurs for some reason or other, e.g., during the above-mentioned glow discharge and to take the necessary steps such as to cut off the output to the target depending on the result of detection.

As a solution, it is known to dispose a rectifying circuit which supplies DC power, and a bridge circuit which is connected to the positive and the negative output ends of the rectifying circuit and is made up of four switching elements so that AC pulsed power potential is charged to the paired targets alternately at a predetermined frequency (see, e.g., patent document 2).

In the above-mentioned art, however, since discharge is caused to take place between the targets that make a pair, the discharge current flows only between the targets. In such a case, if the output frequency is lowered (e.g., 10 kHz or less) in order to detect the anomalous electric discharge or to facilitate the subsequent processing work, plasma tends to be partially generated only in front of the targets that are being outputted (or that are receiving outputs. As a result, there is a problem in that it becomes difficult to attain a uniformity in the film thickness distribution of the thin film to be formed on the surface of the substrate.
Patent Document 1: JP-A-2005-290550
Patent Document 2: JP3639605

DISCLOSURE OF THE INVENTION

Problems to be Solved by the Invention

Therefore, in view of the above points, it is an object of this invention to provide a power supply apparatus which is easy in attaining uniformity in the film thickness distribution of a thin film to be formed on the surface of the substrate, even in case an output is made, at a low frequency, to the targets that make a pair.

Means for Solving the Problems

In order to solve the above problems, the power supply apparatus according to this invention comprises: a first discharge circuit which charges a pair of electrodes in contact with a plasma with a predetermined potential by alternately reversing polarity at a predetermined frequency so that discharge current alternately flows from one electrode of the pair of electrodes to the other electrode of the pair of electrodes; and a second discharge circuit which charges the other electrode of the pair of electrodes and grounding, the other electrode being adapted to receive an incoming discharge current by the first discharge circuit, with a predetermined potential so that discharge current flows from the grounding to the other electrode.

According to this invention, in addition to the path in which the discharge current flows by the first discharge circuit from one electrode of the pair of electrodes to the other electrode of the pair of electrodes, there is made available a second path in which the discharge current flows by the second discharge circuit to the other electrode of the pair of electrodes through the grounding.

As described above, according to the arrangement of this invention, in addition to the path in which the discharge current flows between the pair of electrodes, there is further provided the path in which the discharge current flows between the electrode and the grounding. The power supply apparatus of this invention may be applied to a sputtering apparatus which is arranged to charge the targets, which make respective pairs out of the targets disposed in alignment with one another, with a predetermined pulsed potential by alternately changing the polarity at a predetermined frequency. Then, even in case output is made to the targets at a lower frequency, not only in front of the targets that are receiving the output, but also in front of all the targets disposed in alignment with one another will the plasma come to be generated. As a result, at the time of forming a predetermined thin film on the surface of the substrate, the film thickness distribution can be made uniform more easily.

In this invention, preferably the first discharge circuit has: a DC power supply source; and a bridge circuit which is constituted by switching elements connected to a positive DC output and a negative DC output from the DC power supply source. The first discharge circuit is adapted to control the operation of each of the switching elements in the bridge circuit to output to the pair of electrodes. The second discharge circuit has another DC power supply source, an end of the positive DC output from said another DC power supply source is grounded, and an end of the negative DC output is connected to the pair of electrodes through other switching elements which are interlocked with the operation of the switching elements in the bridge circuit.

On the other hand, preferably, the first discharge circuit has: a DC power supply source; and a bridge circuit which is constituted by switching elements connected to a positive DC output and a negative DC output from the DC power supply source. The first discharge circuit is adapted to control the operation of each of the switching elements in the bridge circuit to output to the pair of electrodes. The second discharge circuit is a branch circuit in which the positive DC output from the DC power supply source is branched for grounding. The branch circuit has a resistor or a switching element connected in parallel with the resistor. In this manner, the number of the constituent parts can be reduced to lower the cost.

In this invention, preferably the second discharge circuit has a diode in the positive DC output, the grounding side of the diode being defined as a cathode. Then, in case arcing occurs for some reason or other, the reverse current to the second discharge circuit can advantageously be prevented.

Preferably, each of the first and the second discharge circuits has an inductor which is disposed in at least one of the positive DC output and the negative DC output, and a diode which is connected in series with the inductor to short-circuit the inductor at a time of an occurrence of overvoltage.

In this invention, preferably the electrodes are targets disposed in a processing chamber in which sputtering is performed.

BEST MODE FOR CARRYING OUT THE INVENTION

With reference to the accompanying drawings a description will now be made of a power supply apparatus E according to an embodiment of this invention. The power supply apparatus E is used to charge (output) a pair of targets T1, T2, which serve as electrodes to come into contact with a plasma P, with AC pulsed power at a predetermined frequency, the targets T1, T2 being disposed opposite to a substrate S which is to be processed and is present inside a vacuum chamber M1, e.g., of a sputtering apparatus M. The power supply apparatus E is. The power supply apparatus E has: a first discharge circuit E1 and a second discharge circuit E2; and a control means C which centrally controls the operation, and the like of switching elements (to be described hereinafter) which are disposed in the first discharge circuit E1 and the second discharge circuit E2 (see FIG. 1).

The first discharge circuit E1 has a DC power supply source 1 which enables the supply of DC power. The DC power supply source 1 has: an input part which receives an input, e.g., of commercial AC power supply (3-phase, AC 200V or 400V, not illustrated); and a rectifying circuit which is made up of diodes for converting the inputted AC power to DC power. The DC power supply source 1 thus outputs DC power to an oscillation part through a positive DC power line 1a and a negative DC power line 11b. Between the DC power lines 11a, 11b there is provided a switching transistor which is controlled by the control means C through an output oscillation driver circuit (not illustrated). It is thus so arranged that the supply of DC power to the oscillation part can be controlled.

The oscillation part has a bridge circuit 12 which is made up of a first through a fourth, a total of four, switching transistors (switching elements) SW11 through SW14 which are connected between the positive and the negative DC power lines 11a, 11b. The output lines from the bridge circuit 12 are respectively connected to the pair of targets T1, T2. The ON or OFF switching of each of the switching transistors SW11 through SW14 is controlled by the control means C through a driver circuit for output oscillation (not illustrated). The switching of each of the switching transistors SW11 through SW14 is controlled such that the timing is reversed of switching ON or OFF, e.g., of the first and the fourth switching transistors SW11, SW14 and of the switching transistors SW12, SW13. Predetermined pulsed potential is thus charged (outputted) to the pair of targets T1, T2 by alternately changing the polarity at a predetermined frequency (e.g., 1 to 10 kHz).

If each of the switching transistors SW11 through SW14 is switched in a state in which DC power is being outputted from the DC power supply source 1, their switching losses will be large. Therefore, it is necessary to arrange such that the durability of each of the switching transistors SW11 through SW14 is improved. As a solution, between the positive and the negative DC output lines 11a, 11b from the DC power supply source 1, there is disposed a switching transistor SW15 for output short-circuiting, in which the ON or OFF switching is controlled by the control means C through a driver circuit (not illustrated) for output oscillation.

In a state in which the switching transistor SW15 for output short-circuiting is short-circuited (i.e., in a state in which output to the targets T1, T2 is cut off), switching is arranged to be made of each of the switching transistors SW11 through SW14 of the bridge circuit 12 (see FIG. 2). In other words, in a state in which the switching transistor SW15 is short-circuited (ON), the first and the fourth switching transistors SW11, SW14, for example, are switched ON. Thereafter, the short-circuiting of the switching transistor SW15 is released (OFF) to thereby output to one T1 of the targets (i.e., negative pulsed potential is charged to the target T1). Subsequently, the switching transistor SW15 is short-circuited again and switch OFF the first and the fourth switching transistors SW11, SW14, and the second and the third switching transistors SW12, SW13 are switched ON. Thereafter, the switching transistor SW15 is switched OFF to thereby output to the other T2 of the targets (i.e., negative pulsed potential is charged to the target T2).

According to this arrangement, the switching loss that occurs at the time of outputting to the targets T1, T2 occurs only in the switching transistor SW15, while little or no switching loss occurs to each of the switching transistors SW11 through SW14. As a result, without using a high-performance switching element, a high durability can be attained. In addition, there is required no sufficient heat-radiating mechanism that would otherwise be required in case the switching losses occur in the four switching elements. A lower cost can be attained with this arrangement.

The second discharge circuit E2 is provided with a DC power supply source 2 that is of the same construction as the one in the first discharge circuit E1. The positive DC power line 21a from the DC power supply source 2 is connected to the vacuum chamber M1 that is grounded. Further, the negative DC power line 21b from the DC power supply source 2 is branched and is connected to the output lines 13a, 13b, respectively, of the first discharge circuit E1. In this case, the branch lines 22a, 22b from the negative DC power line 21b are respectively provided with switching transistors SW21, SW22 which are actuated in interlocking with the switching transistors SW11 through SW14 of the bridge circuit 12 (see FIG. 1).

The switching ON or OFF of both the switching transistors SW21, SW22 is controlled by the control means C through a driver circuit for output oscillation (not illustrated). For example, in case one T1 of the targets is receiving application of electric power by the first discharge circuit E1 in a state in which the first and the fourth switching transistors SW11, SW14 are switched ON, the switching transistor SW21 is switched ON and predetermined power is arranged to be applied to the other T2 of the targets by the second discharge circuit (see FIG. 2).

Suppose that each of the targets T1, T2 is sputtered by outputting to the pair of targets T1, T2 by the first and the second discharge circuits E1, E2 while introducing a gas such as Ar and the like in a constant flow amount through a gas introducing means (not illustrated) in a state in which the vacuum chamber M1 is kept to a predetermined vacuum degree. Then, when the first and the fourth switching transistors SW11, SW14, for example, are switched ON (in this case, the second and the third switching transistors SW12, SW13 are in a switched-OFF state), the discharge current Iac flows from one T1 of the targets to the other T2 thereof by the first discharge circuit E1. Also, when the switching transistor SW22 is switched ON (in this case, the switching transistor SW22 is in a state of being switched OFF), the discharge current Idc is caused to flow by the second discharge circuit E2 from the grounded vacuum chamber M1 to the other T2 of the targets.

Then, when the timing of ON or OFF of the first and the fourth switching transistors SW11, SW14 and of the second and the third switching transistors SW12, SW13 of the first discharge circuit E1 is reversed, the timing of ON or OFF of each of the switching transistors SW21, SW22 of the second discharge circuit E2 is also reversed, so that an output is made to the pair of targets T1, T2 at a predetermined frequency. According to this arrangement, each of the targets T1, T2 is alternately switched to the anode electrode and to the cathode electrode. Glow discharge is caused to be generated between the anode electrode and the cathode electrode and between the cathode electrode and the grounding so as to form a plasma atmosphere. Each of the targets T1, T2 thus gets sputtered.

As described so far, the power supply apparatus E according to this embodiment has a path in which the discharge current Idc flows between one T1 or T2 of the targets and the grounding, in addition to the path in which the discharge current Iac flows between the pair of targets T1, T2. Therefore, in case the discharge current flows only between the pair of targets like in the known art, plasma tends to be partially generated only in front of the target receiving an output at the time of low frequency. On the other hand, in the power supply apparatus E according to this embodiment, plasma P tends to be generated over the extent of the front side of both the targets T1, T2 (see FIG. 1). As a result, at the time of forming a predetermined thin film on the surface of the substrate S, the film thickness distribution can be easily made uniform.

In the second discharge circuit E2, too, the following arrangement is preferable, i.e., a switching transistor SW23 for output short-circuiting is disposed between the positive and the negative DC power lines 21a, 21b. In the same manner as in the above-mentioned first discharge circuit E1, the switching loss, which is generated at the time of outputting to the targets T1, T2, is thus generated only in the switching transistor SW23.

By the way, during the above-mentioned glow discharge, there are cases where arcing (anomalous electric discharge) may take place for some cause or other. There is thus a possibility that reverse current flows at the time of anomalous electric discharge to thereby damage the second discharge circuit E2. Therefore, the positive DC power line 21a is provided with a diode 24 with the grounding side serving as cathode.

In addition, since the outputs from the DC power supply sources 1, 2 have constant voltage characteristics, the capacitance component (capacitance) becomes more dominant than the inductance component. If the capacitance component (capacitance) is dominant in this manner, the impedance on the plasma load side becomes small at the time of occurrence of arcing, whereby the output and the plasma load are coupled so as to be rapidly discharged from the capacitance component to the output side.

As a solution, each of the positive and the negative DC output lines 11a, 11b and 21a, 21b of the first and the second discharge circuits E1, E2 is provided with an inductor 3 that has a larger inductance value than the inductance value of the plasma. The rate of rise in electric current per unit time is thus arranged to be limited at the time of occurrence of arcing.

Further, in order to restrict or suppress the overvoltage that may occur at the time of switching of each of the switching transistors SW11 through SW14 and SW21, SW22, there is provided a diode 4 and a resistor 5 which are connected in parallel with the above-mentioned inductor 3 and are connected in series with each other. According to this arrangement, at the time of switching each of the switching transistors SW11 through SW14 and SW21, SW22 of the first and the second discharge circuits E1, E2 (at the time of polarity reversal), the output to the targets T1, T2 initially becomes constant voltage characteristics, and the output current gradually increases and thereafter (when the output current reaches a predetermined value) the output becomes constant current characteristics. As a result, the overvoltage can be prevented from occurring at the time of polarity reversal at each of the electrodes, and the occurrence of arcing due to overcurrent can be suppressed.

Further, in this embodiment, the inductor 3, the diode 4 and the resistor 5 are arranged to be disposed in the positive and the negative output lines 11a, 11b and 21a, 21b, respectively. They may alternatively be disposed in one of the DC output lines 11a, 11b and 21a, 21b.

In this embodiment a description has been made of an example in which the second discharge circuit E2 has another DC power supply source 2 that is different from the first discharge circuit E1, but is not limited thereto. With reference to FIG. 3, the second discharge circuit E20 relating to a modified example has an arrangement in which the positive DC output 11a from the DC power supply source 1 of the first discharge circuit E1 is branched so as to be grounded. The second discharge circuit E20 may alternatively be made up of a resistor 31 disposed in the branched line 30, or be made up of a switching element 33 (branched circuit) that is connected to the branched line 30 in parallel with a resistor 32. In this case, the resistor value of the resistor 31, 32 may be appropriately selected depending on the power to be charged by the first discharge circuit E1 in case a thin film formation is made by using the sputtering apparatus M. According to this arrangement, the circuit construction of the power supply apparatus E becomes simpler and the number of constituent parts is reduced. Reduction in cost can thus be attained.

Further, in this embodiment, a description has been made of an example in which an output is made through a single power supply source to a pair of targets T1, T2 disposed in the vacuum chamber M1, but the embodiment is not limited thereto. This invention may be applied to a case: in which the power supply apparatus E of the same construction is allocated to each of the targets that make a pair out of the plurality of targets of the same shape aligned with, and at the same distance from, one another opposite to the substrate S inside the vacuum chamber; and in which AC pulsed potential is charged to each of the targets at a predetermined frequency. Further, the power supply apparatus E of this invention may also be applied to a case in which output is made by a plurality of AC power supplies to a pair of targets.

Figure 1:
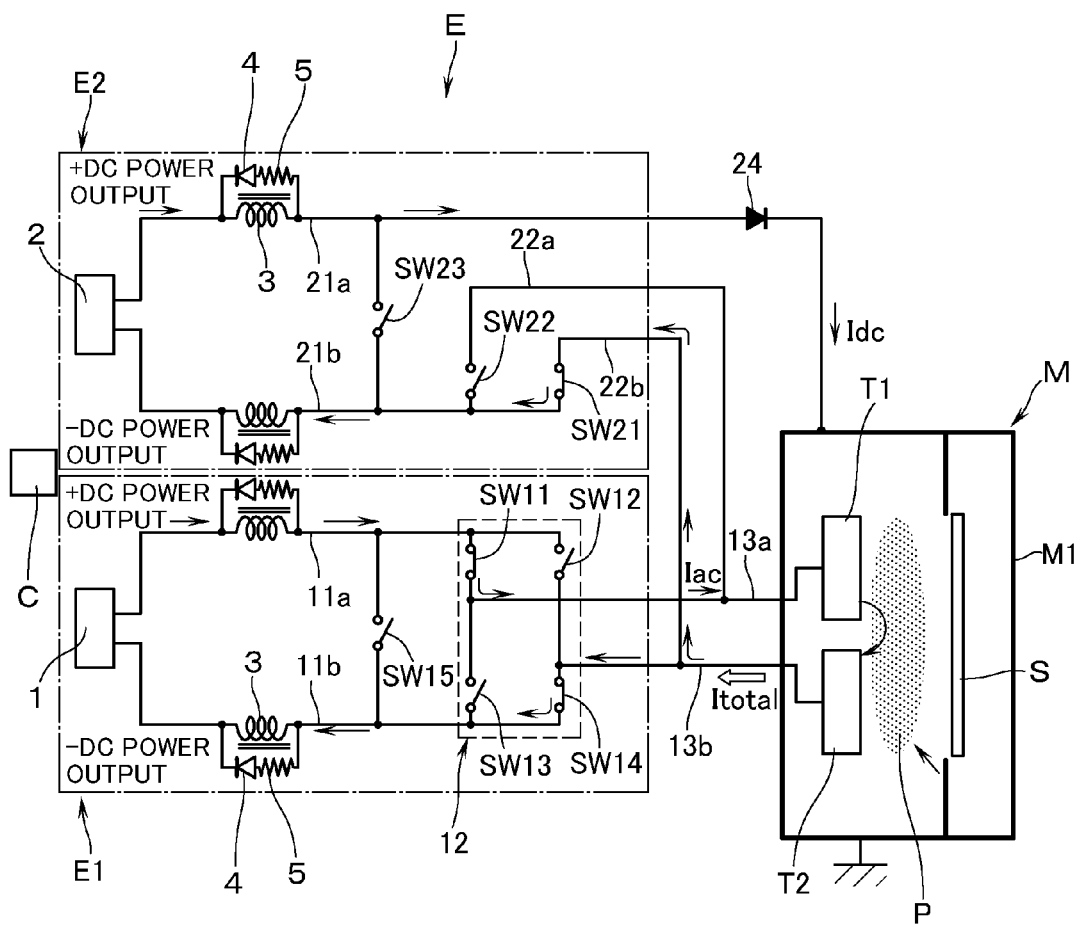
FIG. 1 is a schematic diagram showing the arrangement of AC power supply of this invention.
Figure 2:
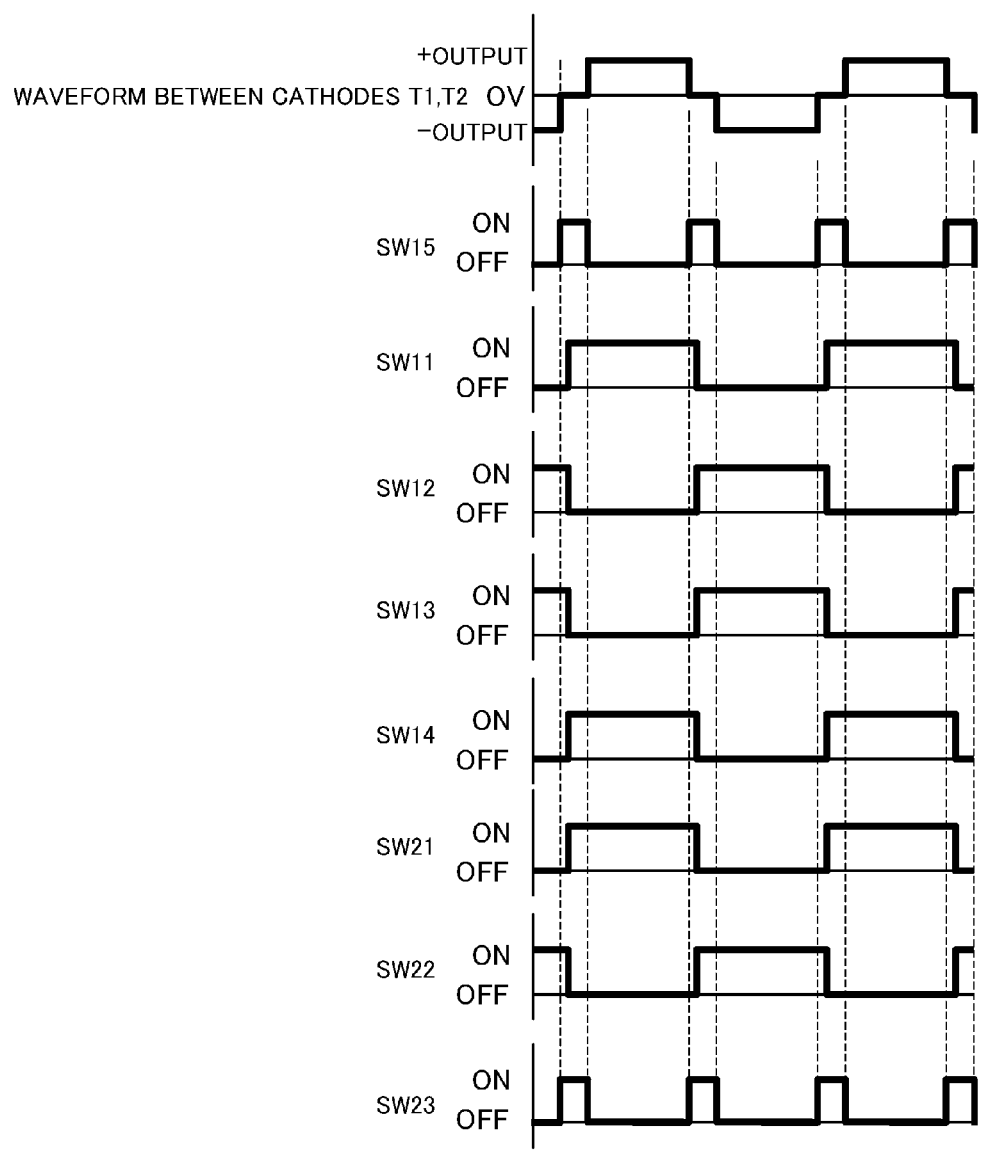
FIG. 2 is a graph showing the output control of AC power supply of this invention.
Figure 3:
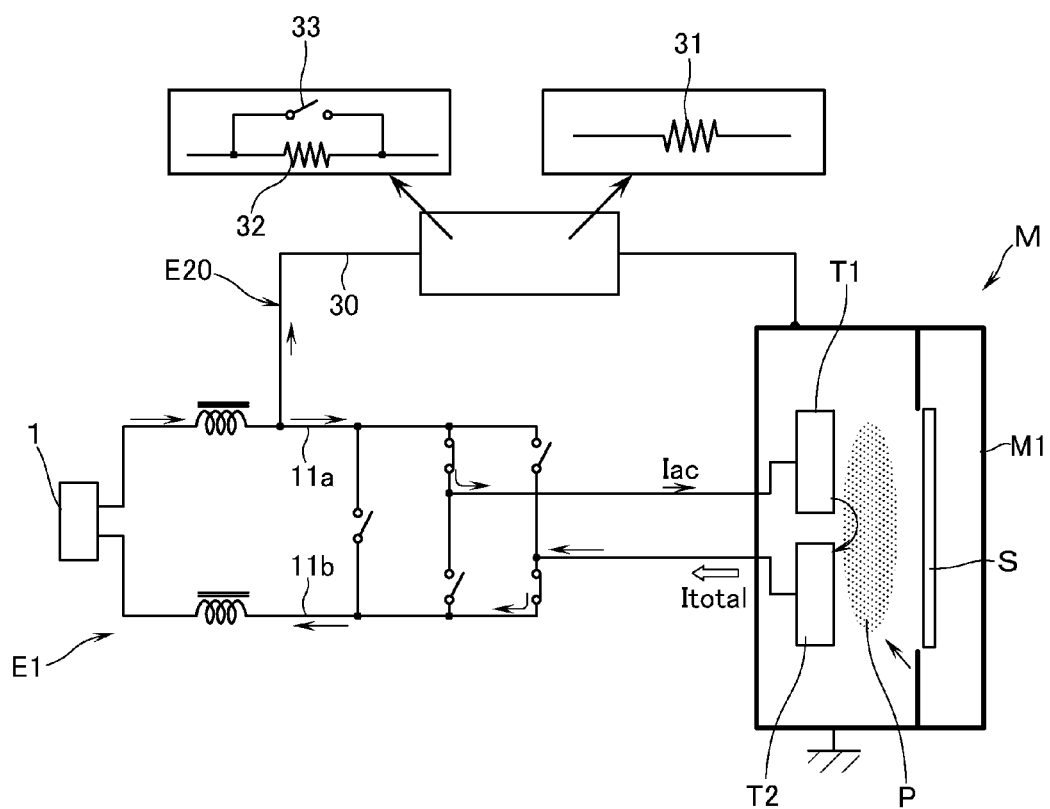
FIG. 3 is a schematic diagram showing the arrangement of a modified example of the AC power supply of this invention.

DESCRIPTION OF REFERENCE NUMERALS AND CHARACTERS 1, 2 DC power supply source
12 bridge circuit
3 inductor
4, 24 diode
5 resistor
E power supply apparatus
E1 first discharge circuit
E2 second discharge circuit
M sputtering apparatus
M1 vacuum chamber
SW11 through SW15 switching transistor (switching element)
SW21 through SW23 switching transistor (switching element)
T1, T2 electrode (target)

What is claimed is:
1. A power supply apparatus comprising:
a first discharge circuit which alternately charges a predetermined potential at a predetermined frequency to a first electrode and a second electrode which are in contact with a plasma in a chamber; and
a second discharge circuit which charges a predetermined potential to the chamber being grounded and one of the first and second electrodes that is not receiving an output from the first discharge circuit,
wherein the first discharge circuit has:
a DC power supply source; and
a bridge circuit which is constituted by switching elements connected to a positive DC output and a negative DC output from the DC power supply source, the first discharge circuit being adapted to control the operation of each of the switching elements in the bridge circuit to output to the first and second electrodes,
wherein the second discharge circuit has another DC power supply source, an end of the positive DC output from said another DC power supply source is grounded, and an end of the negative DC output is connected to the first and second electrodes through other switching elements which are interlocked with the operation of the switching elements in the bridge circuit, and
wherein the other switching elements are controlled so as to connect the end of the negative DC output of said another DC power supply source to one of the first and second electrodes having electric potential lower than the other of the first and second electrodes when the predetermined potential is charged to the first discharge circuit.

2. The power supply apparatus according to claim 1, wherein the second discharge circuit has a diode in the positive DC output, the grounding side of the diode being defined as a cathode.

3. The power supply apparatus according to claim 1, wherein each of the first and the second discharge circuits has an inductor which is disposed in at least one of the positive DC output and the negative DC output, and a diode which is connected in parallel with the inductor to short-circuit the inductor at a time of an occurrence of overvoltage.

4. The power supply apparatus according to claim 1, wherein the first and second electrodes are targets disposed in a processing chamber in which sputtering is performed.

5. The power supply apparatus according to claim 1, wherein a short circuited state of an output-short-circuiting switching element which is disposed between the positive and the negative DC outputs from the DC power supply source, and
wherein, during the short-circuited state, the switching elements are operated such that ON or OFF timing is reversed, and a switching timing of the output-short-circuiting switching element is mutually deviated from the switching elements.

6. The power supply apparatus comprising according to claim 1, wherein the first and second discharge circuits concurrently charge.

* * * * *